(12) United States Patent
Steffan et al.

(10) Patent No.: US 6,421,574 B1
(45) Date of Patent: Jul. 16, 2002

(54) AUTOMATIC DEFECT CLASSIFICATION SYSTEM BASED VARIABLE SAMPLING PLAN

(75) Inventors: Paul J. Steffan, Elk Grove; Allen S. Yu, Fremont, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/404,079

(22) Filed: Sep. 23, 1999

(51) Int. Cl.[7] .......................... G06F 19/00; H01L 21/66
(52) U.S. Cl. .................... 700/121; 700/110; 438/14; 438/16
(58) Field of Search .................... 700/104, 108–110, 700/121, 174; 438/14, 16

(56) References Cited

U.S. PATENT DOCUMENTS

| | | | |
|---|---|---|---|
| 4,514,436 A | * 4/1985 | Moerschel | 205/791 |
| 5,369,604 A | * 11/1994 | Ravindranath et al. | 324/158.1 |
| 6,314,379 B1 | * 11/2001 | Hu et al. | 700/110 |

* cited by examiner

*Primary Examiner*—Leo Picard
*Assistant Examiner*—Elliot Frank
(74) *Attorney, Agent, or Firm*—H. Donald Nelson

(57) ABSTRACT

A method of manufacturing semiconductor devices in which scan data for a current layer of a wafer of a lot being manufactured is compared to previous scan data for previous lots that has been stored in a defect management system. The automatic defect classification system determines whether additional wafers need to be scanned in order to obtain accurate defect data for the production lot to determine whether the current lot should or should not be placed on hold.

7 Claims, 3 Drawing Sheets

AUTOMATIC DEFECT CLASSIFICATION SYSTEM BASED VARIABLE SAMPLING PLAN

BACKGROUND OF THE INVENTION

1. Field of the Invention

This invention relates generally to a methodology for the capture and classification of silicon based defects in the manufacture of semiconductor wafers. More specifically, this invention relates to a methodology for the capture and rapid classification of silicon based defects in the manufacture of semiconductor wafers. Even more specifically, this invention relates to a methodology for the capture and rapid classification of silicon based defects in the manufacture of semiconductor wafers that avoids the inherent lag time between defect capture and engineering disposition of lots on hold from high defectivity.

2. Discussion of the Related Art

In order to remain competitive, a semiconductor manufacturer must continuously increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of circuits per unit area on an integrated circuit chip. Another part of reducing the cost of a semiconductor chip is to increase the yield. As is known in the semiconductor manufacturing art, the yield of chips (also know as die) from each wafer is not 100% because of defects that occur to die during the manufacturing process. The number of good chips obtained from a wafer determines the yield. As can be appreciated, the cost of defective chips that must be discarded because of a defect or defects must be amortized over the remaining usable chips.

A single semiconductor chip can require numerous process steps such as oxidation, etching, metallization, ion implantation, thermal annealing, and wet chemical cleaning. These are just a few of the many types of process steps involved in the manufacture of a semiconductor chip. Some of these process steps involve placing the wafer on which the semiconductor chips are being manufactured into different tools during the manufacturing process. The optimization of each of these process steps requires an understanding of a variety of chemical reactions and physical processes in order to produce high performance, high yield circuits. The ability to view and characterize the surface and interface layers of a semiconductor chip in terms of their morphology, chemical composition and distribution is an invaluable aid to those involved in research and development, process, problem solving, and failure analysis of integrated circuits. A major part of the analysis process is to determine if defects are caused by one of the process tools, and if so, which tool caused the defects.

As the wafer is placed into different tools during manufacture, each of the tools can produce different types of particles that drop onto the wafer and cause defects that have the potential to "kill" a die that decreases the yield. In order to develop high yield semiconductor processes and to improve existing ones, it is important to identify the sources of the various particles that cause defects and then to prevent the tools from dropping these particles onto the wafer while the wafers are in the tools.

In order to be able to quickly resolve process or equipment issues in the manufacture of semiconductor products, a great deal of time, effort and money is being expended by semiconductor manufacturers to capture and classify defects encountered in the manufacture of semiconductor products. Once defects are detected, properly described, and classified, efforts can begin to resolve the cause of the defects and to eliminate the cause of the defects. The biggest problem that faced the semiconductor manufacturers and one of the most difficult to solve was the problem associated with the training and maintenance of a cadre of calibrated human inspectors who can classify all types of defects consistently and without error. This problem was mainly caused by unavoidable human inconsistency and as a solution to this problem; Automatic Defect Classification (ADC) systems were developed.

One such system for automatically classifying defects consists of the following methodological sequence. Obtain a defect image from a review station. View the defect image and assign values to elemental descriptor terms called predicates that are general descriptors such as roundness, brightness, color, hue, graininess, etc. Assign a classification code to the defect based upon the values of all the predicates. A typical ADC system could have 40 or more quantifiable qualities and properties that can be predicates. Each predicate can have a specified range of values and a typical predicate can have a value assigned to it between 1 and 256. The range of values that can be assigned to a predicate is arbitrary and can be any range of values. In this example, a value of 1 could indicate that none of the value is present and a value of 256 would indicate that the quality represented by the predicate is ideal. For example, a straight line would have a value of 1 for predicate indicating roundness, whereas a perfect circle would have a value of 256 for the same predicate. The classification code for each defect is determined by the system from the combination of all the predicate values assigned to the defect. The goal of the ADC system is to be able to uniquely describe all the defect types, in such a manner that a single classification code can be assigned to a defect that has been differentiated from all other types of defects. This is accomplished by a system administrator who trains an artificial intelligence system to recognize various combinations and permutations of the 40 or more predicates to assign the same classification code to the same type of defect. This would result in a highly significant statistical confidence in the probability that the defect, and all other defects of the same type or class, will always be assigned the same classification code by the ADC system. Performing a "best-fit" calculation against all assigned classification codes does this. If the fit is not good enough, the system will assign an "unknown" code, which means the system needs further training for that device/layer/defect.

In order to make the data generated from the ADC system statistically sound, randomness must be maintained in the selection of defects for automatic defect classification process. To accomplish this task, a system has been developed that pre-selects defects for classification based on data from the current scan and previous scans. All previously caught defects and "cluster" defects are removed from the target population and "n" defects are randomly selected from that group. These defect locations are then sent to the review tool for automatic defect classification.

One of the problems with this methodology is the inherent lag time between defect capture and engineering disposition of lots on hold from high defectivity. This disposition often involves scanning more wafers to determine the extent of the defectivity. With the large overhead of recipe download, wafer alignment, and machine queue time, cycle time is severely affected.

FIG. 1 is a flow diagram describing the movement of a selected wafer or wafers through all the processes in a current methodology of manufacturing semiconductor wafers. As is known in the semiconductor manufacturing art, a production lot of wafers can be any selected number of wafers. As is also known in the semiconductor manufacturing art, it is not practical to scan each wafer for defects because inspecting each wafer is extremely time consuming, manpower intensive and equipment intensive. Therefore, a small number of wafers are selected from each production lot to be representative of that production lot. In some cases, only one wafer from a production lot is selected to be tested. This wafer is scanned for defects after each manufacturing process that has been designated to be a process that will be tested. It is also noted that the wafer is not scanned after each process because this would also be time consuming, manpower and equipment intensive. It has also been shown that good results can be obtained by scanning the selected wafer only after certain designated processes. The start of the process is indicated at 100. All wafers in the production lot are sent through the first manufacturing process as indicated at 102. After the first process is complete, the selected wafer (or wafers) is (are) examined for defects at 104. The wafers are examined for defects at 104 by one of several scan tools that send defect information to an automatic defect classification system 106 that classifies the defects as described above. The defect information and classification information are sent to a defect management system 108 that stores the information for further use. An operator at 110 subjectively determines if the number of defects exceed a preset limit. If it is determined at 112 that the defects exceed the present limit the production lot is put on hold as indicated at 114. Because of time constraints and equipment constraints the lot may be held on hold for days if not weeks until there is a break in the manufacturing schedule for the lot to be resolved. If it is determined at 112 that the number of defects was not outside the preset limits, it is then determined at 116 if the layer just processed is the last layer. If it is determined that the layer just processed is not the last layer, the next layer is processed at 118 and the layer just processed is scanned at 104 and the wafer is processed as described above. If it is determined that the layer just processed is the last layer, the lot is finished as indicated at 120.

FIG. 3 is a graph showing the number of defects on the ordinate and the lot number on the abscissa. As shown in lot 10 at 300 when the number of defects in a single lot exceeds the preset limit, the entire lot may be put on hold. The problem with this procedure is that the remaining lots could be acceptable as indicated by the dashed line at 302. Because the production lot has been put on hold valuable time has been wasted.

FIG. 4 shows an alternate situation in which the number of defects in each lot approaches the preset limit. As can be appreciated, the situation shown in FIG. 4 probably has more detrimental effect than the situation shown in FIG. 3 because the number of defects in lots subsequent to lot 5 is close to the present limit whereas the number of defects shown in FIG. 3 only exceeds or approaches the preset limit in one lot and the entire lot has been put on hold.

Therefore, what is needed is a methodology that avoids the placing on hold a lot and subsequent lots because of a possible anomaly in a semiconductor manufacturing process thereby avoiding the inherent lag time between defect capture and engineering disposition of lots on hold from high defectivity.

SUMMARY OF THE INVENTION

According to the present invention, the foregoing and other objects and advantages are achieved by a method of manufacturing a production lot of wafers wherein current scan data is compared to previous scan data for the same layer/device that has been stored in a defect management system. An automatic defect classification system determines whether additional wafers need to be scanned in order to obtain accurate defect data for the production lot.

In accordance with an aspect of the present invention, wherein at least one additional wafer is scanned if the automatic defect classification system determines that at least one additional wafer needs to be scanned.

In accordance with another aspect of the present invention, it is determined whether the at least one additional wafer is acceptable.

In accordance with another aspect of the present invention, the next layer is processed if it is determined that the at least one additional wafer is acceptable.

The described method of manufacturing semiconductor wafers ensures that the most accurate defect data is obtained for the production lot.

The present invention is better understood upon consideration of the detailed description below, in conjunction with the accompanying drawings. As will become readily apparent to those skilled in the art from the following description, there is shown and an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings wherein:

DETAILED DESCRIPTION

Reference is now made in detail to specific embodiments of the present invention that illustrate the best mode presently contemplated by the inventors for practicing the invention.

Figure 1:
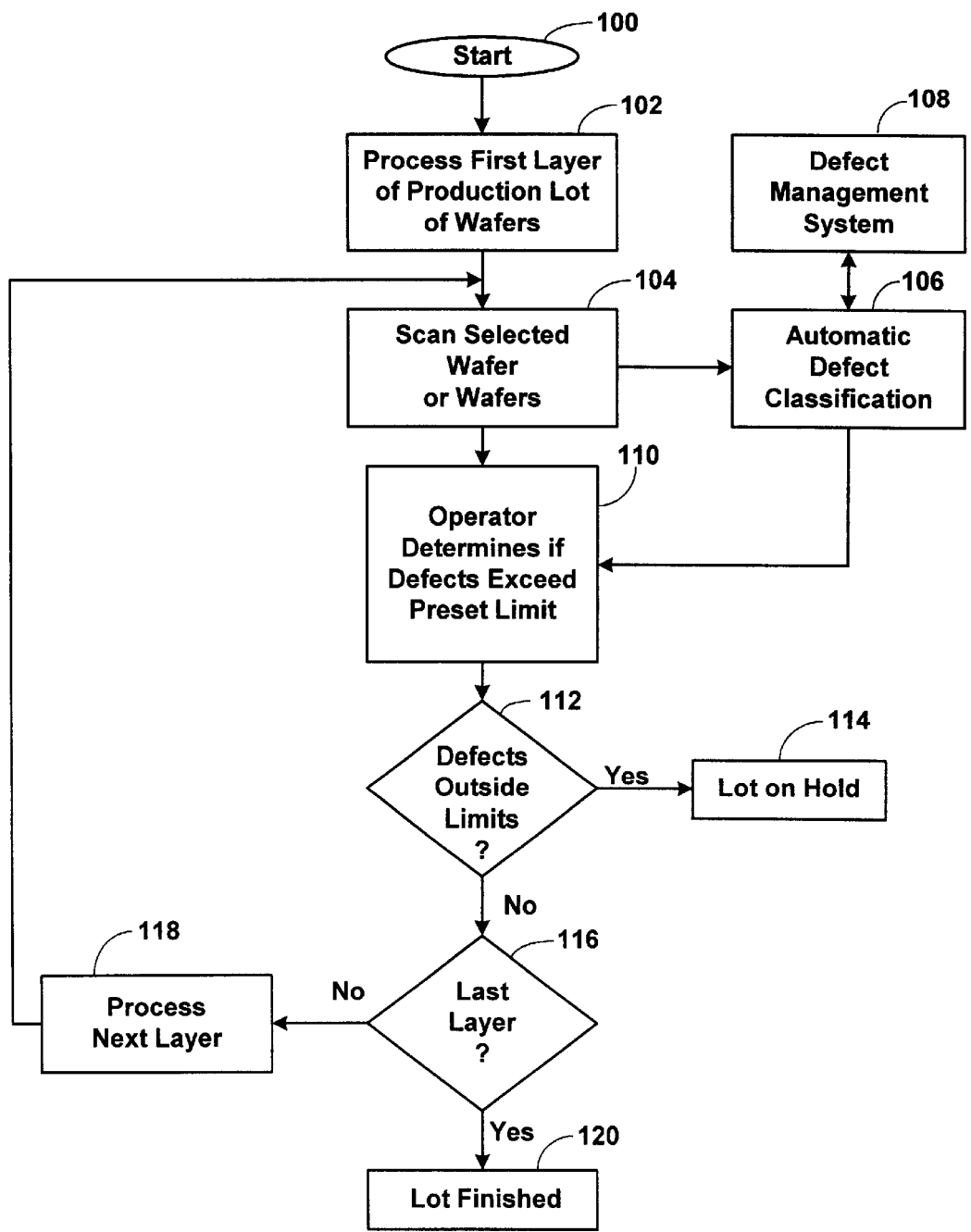
FIG. 1 is a flow diagram describing the movement of a selected wafer or wafers through all the processes in a current methodology of manufacturing semiconductor wafers.
Figure 2:
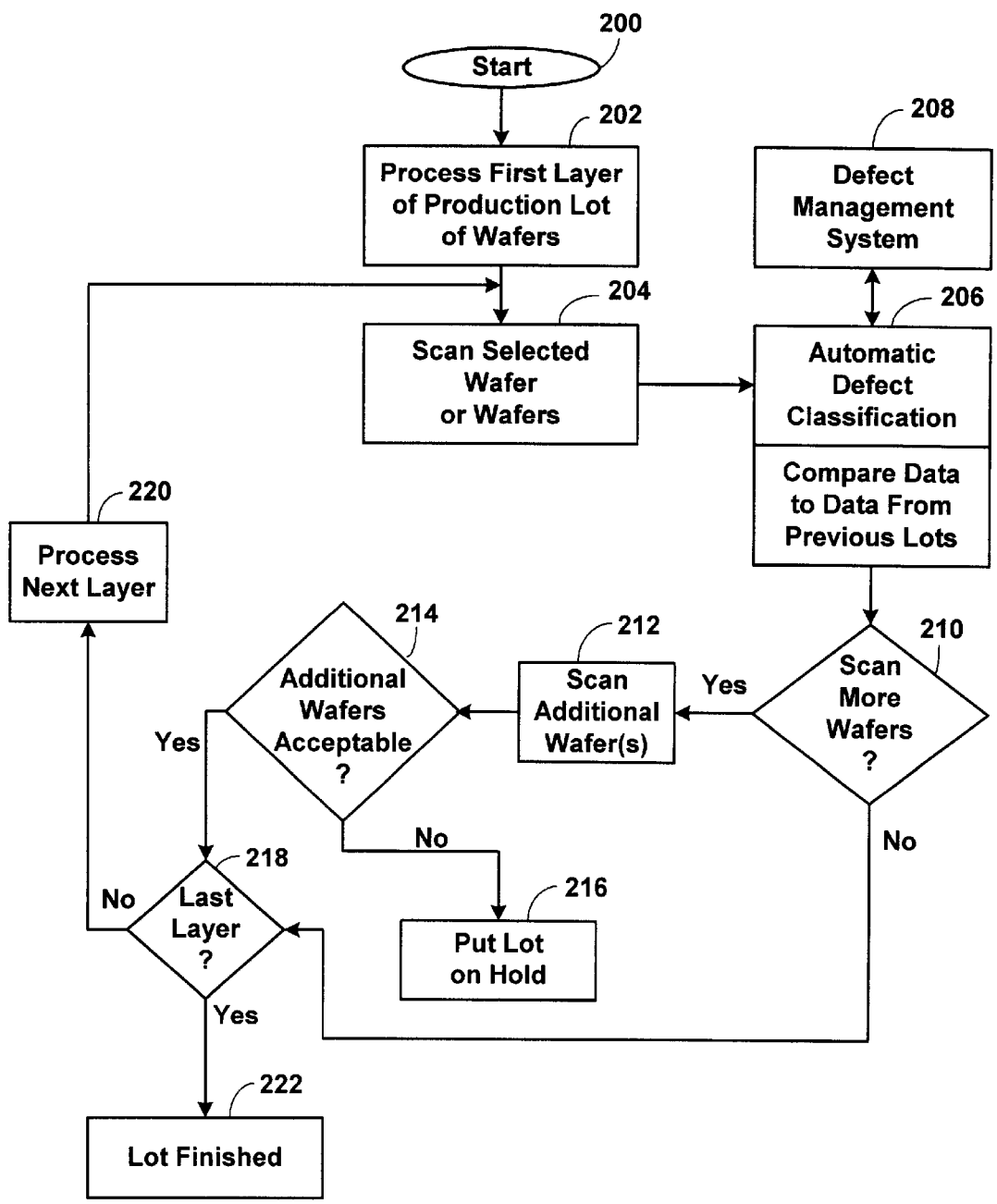
FIG. 2 is a flow diagram describing the movement of a selected wafer or wafers through all the processes in a methodology of manufacturing semiconductor wafers in accordance with the present invention.
Figure 3:
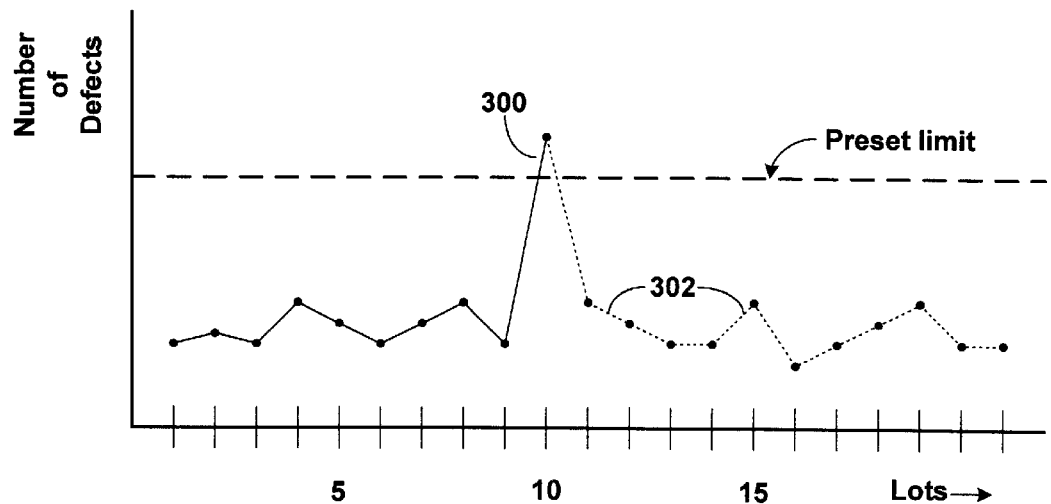
FIG. 3 is a graph showing the number of defects in production lots manufactured showing one lot exceeding a preset number of defects.

FIG. 2 is a flow diagram describing the movement of a selected wafer or wafers through all the processes in a methodology of manufacturing semiconductor wafers in accordance with the present invention. As is known in the semiconductor manufacturing art, a production lot of wafers can be any selected number of wafers. As is also known in the semiconductor manufacturing art, it is not practical to scan each wafer for defects because inspecting each wafer is extremely time consuming, manpower intensive and equipment intensive. Therefore, a small number of wafers are selected from each production lot to be representative of that production lot. In some cases, only one wafer from a production lot is selected to be tested. This wafer is scanned for defects after each manufacturing process that has been designated to be a process that will be tested. It is also noted that the wafer is not scanned after each process because this would also be time consuming, manpower and equipment intensive. It has also been shown that good results can be obtained by scanning the selected wafer only after certain designated processes. The start of the process is indicated at 200. All wafers in the production lot are sent through the first manufacturing process as indicated at 202. After the first process is complete, the selected wafer (or wafers) is (are) examined for defects at 204. The wafers are examined for defects at 204 by one of several scan tools that send defect information to an automatic defect classification system 206 that classifies the defects as described above. The defect information and classification information are sent to a defect management system 208 that stores the information for further use. The automatic defect classification system 206 compares the defect information to data from previous lots and makes a statistical judgment based on scan results from the previous lots not only from this production lot but previous production lots of the same layer/device/technology etc. The automatic defect classification system 206 determines if it is necessary for further wafers to be scanned in order to accurately determine the defectivity of the production lot. If it is determined at 210 that more wafers need to be scanned, an additional wafer or additional wafers at 212 are scanned and it is determined at 214 if the additional wafers are acceptable or not acceptable. If it is determined at 214 that the additional scanned wafers are not acceptable, the production lot is put on hold as indicated at 216. If it is determined at 214 that the additional scanned wafers are acceptable, it is determined at 218 if the layer just processed is the last layer. If it is determined at 218 that the layer just processed is not the last layer, the next layer is processed at 220 and the selected wafers are scanned at 204. If it is determined at 218 that the layer just processed is the last layer, the production lot is finished as indicated at 222.

Figure 4:
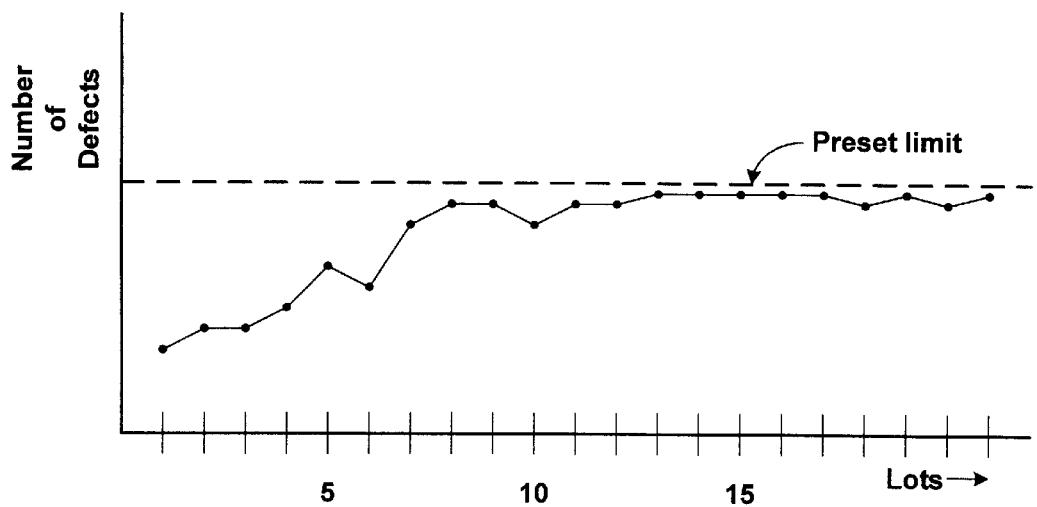
FIG. 4 is a graph showing the number of defects in production lots manufactured showing the number of defects in many lots approaching the preset number of defects indicating that the situation in FIG. 4 is more detrimental than the situation in FIG. 3.

FIG. 4, as discussed above, illustrates a situation in which the number of defects per lot steadily increases until the number of defects per lot is slightly below the preset limit, however, the number of defects is approaching a critical limit and as known in the semiconductor art, the fairly large number of defects cause the yield to be at or near a critical limit. The present invention avoids this situation because the previous lot data is compared to the present lot data and the automatic defect classification system 206 will cause additional wafers to be scanned and if the additional wafers are not acceptable, the production lot will be put on hold until the manufacturing problem is resolved.

The present invention provides an engine as part of the automatic defect classification system that communicates directly with the scan tool during wafer processing. This engine makes statistical judgments based on scan results from previous lots at the current layer and compares it with the current scan data. Since the defects can be classified "in situ" it is possible to eliminate the nuisance defects and make a determination based on actual defects of interest, such as killer defects, or defects that point to a particular process problem. For example, when trigger levels of a certain defect type are reached an increase in the sample plan can be implemented automatically.

The benefits of the invention include the following:
1. The ability to change the lot level sampling plan on the fly.
2. It allows for specific defect type screening.
3. It standardizes dispositioning of discrepant material.

In summary, the present invention overcomes the limitations of the prior art and fulfills the need for a method of obtaining the most accurate defect data for the production lot.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing semiconductor devices, the method comprising:

(a) sending a production lot of wafers through a manufacturing process;

(b) processing a layer of the production lot of wafers;

(c) selecting at least one wafer from the production lot of wafers;

(d) scanning the layer of the at least one selected wafer from the production lot in a scan tool to determine if there are defects present on the layer of the at least one selected wafer;

(e) if defects are detected on the layer by the scan tool, sending defect information from the scan tool to an automatic defect classification system;

(f) comparing the defect information to defect information stored in a defect management system from previous production lots of wafers; and (g) determining whether at least one additional wafer needs to be scanned in order to obtain accurate defectivity data.

2. The method of claim 1 further comprising scanning at least one more wafer if it is determined in step (g) that at least one additional wafer needs to be scanned.

3. The method of claim 2 further comprising (i) determining whether the at least one additional wafer is acceptable.

4. The method of claim 3 further comprising (j) determining if the layer just processed is the last layer if it is determined at step (i) if the additional at least one wafer is acceptable.

5. The method of claim 4 further comprising (k) processing the next layer if it is determined at (j) that the layer just processed is not the layer.

6. The method of claim 3 further comprising (l) putting the production lot on hold if it determined at (i) that the at least one additional wafer is not acceptable.

7. The method of claim 5 further comprising repeating step (k) until it is determined at (j) that the layer just processed is the last layer.

* * * * *